United States Patent [19]
Steiner et al.

[11] Patent Number: 6,064,202
[45] Date of Patent: May 16, 2000

[54] SPINNING CURRENT METHOD OF REDUCING THE OFFSET VOLTAGE OF A HALL DEVICE

[75] Inventors: Ralph Steiner, Winterthur; Andreas Haeberli, Bulach; Franz-Peter Steiner, Schwyz; Christoph Maier, Oberengstringen, all of Switzerland

[73] Assignee: Physical Electronics Laboratory, Zurich, Switzerland

[21] Appl. No.: 09/068,398

[22] PCT Filed: Sep. 9, 1997

[86] PCT No.: PCT/EP97/04932

§ 371 Date: Aug. 24, 1998

§ 102(e) Date: Aug. 24, 1998

[87] PCT Pub. No.: WO98/10302

PCT Pub. Date: Mar. 12, 1998

[51] Int. Cl.[7] .................................................. G01R 33/06
[52] U.S. Cl. ........................... 324/251; 327/511; 324/225
[58] Field of Search .................................... 324/225, 251, 324/207.2, 252, 117 H, 244; 338/32 H, 32 R; 323/368; 310/DIG. 3; 327/510, 511

[56] References Cited

U.S. PATENT DOCUMENTS 4,037,150  7/1977  Taranov et al. ......................... 324/251
4,668,914  5/1987  Kersten et al. ......................... 324/251

FOREIGN PATENT DOCUMENTS 43 02 342  7/1993  Germany .

OTHER PUBLICATIONS

Munter, P.J.A., "Electronic Circuitry for a Smart Spinning–Current Hall Plate with Low Offset", *Sensors and Actuators A*, vol. A27, No. 1–3, May 1, 1991.

Bellekom & Munter, "Offset Reduction in Spinning–Current Hall Plates", *Sensors and Materials*, vol. 5, No. 5 (1994) pp. 253–263., 1994. Month not available.

*Primary Examiner*—Jay Patidar
*Attorney, Agent, or Firm*—Walter C. Farley

[57] ABSTRACT

The method serves for dynamically compensating the offset voltage of a Hall device. The Hall device can have either a platelike structure with at least two contact pairs, or any other arrangement deriveable by conformal mapping. The contact pairs are angled by e.g. 90°. Each pair is supplied with a periodically alternating current whereby the phase shift of the supply currents corresponds to the spatial phase shift of the contact pairs and is e.g. 90°. Superposition of the supplied currents results in a continuously spinning current vector in the Hall device. By measuring simultaneously the voltages between corresponding terminals, a signal consisting of the Hall voltage and a periodic offset voltage can be isolated. The offset voltage is eliminated by averaging the signal over at least one period.

10 Claims, 5 Drawing Sheets

CONTROL CIRCUITRY FOR SUBSTRATE VOLTAGE $V_{sub}$

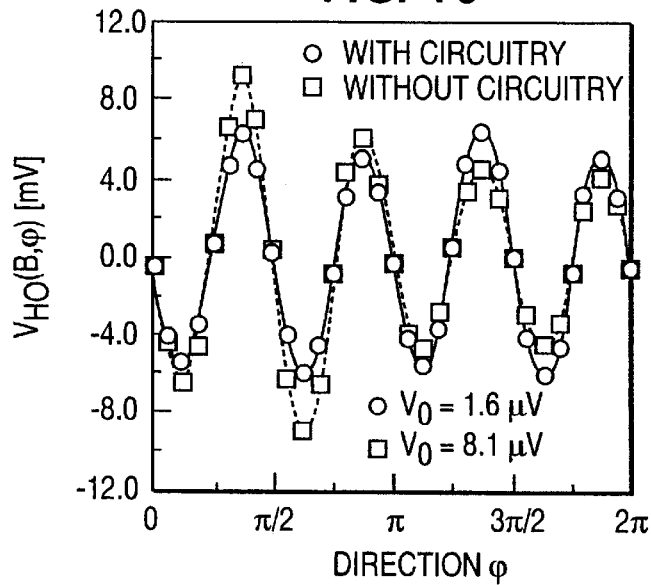
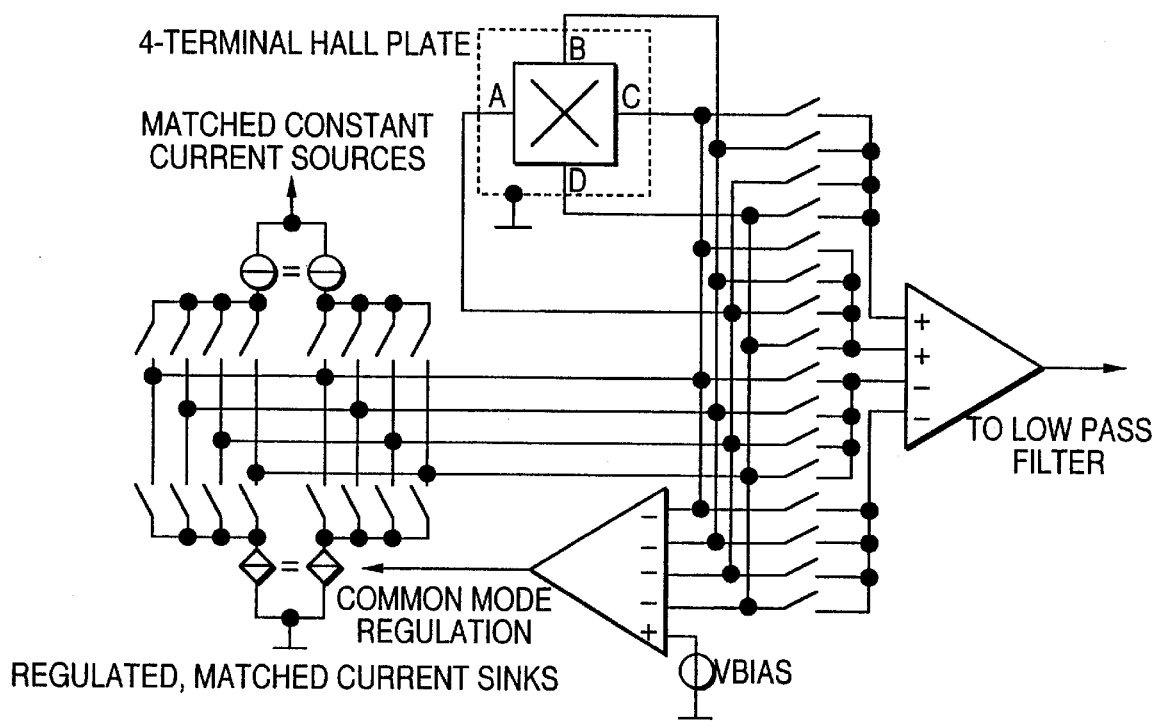

SPINNING CURRENT METHOD OF REDUCING THE OFFSET VOLTAGE OF A HALL DEVICE

FIELD OF THE INVENTION

The invention is in the field of integrated micro sensors, in particular sensors for measuring a magnetic field (Hall devices).

BACKGROUND OF THE INVENTION

A Hall device usually has the form of a plate, but not necessarily. This plate consists of conducting material provided with at least four electrical contacts at its periphery. A bias current I is supplied to the device via two opposite contacts, called the current contacts. The two other contacts are placed at two equipotential points at the plate boundary. These contacts are called the voltage contacts or the sense contacts. If a magnetic field perpendicular to the surface is applied to the device, a voltage appears between the sense contacts due to the Hall effect. This voltage is called the Hall voltage. An example of a Hall device is shown in FIG. 1, where for the basic function only the contact pairs AC and BD are used.

A major problem of Hall devices is their offset voltage. The offset voltage is a static or a very low frequency output voltage at the sense contacts of the Hall device in the absence of a magnetic field. The causes of offset voltages in integrated Hall devices are imperfections of the fabrication process and nonuniformity of materials. An offset reduction method according to the state of the art is the switched spinning current method. This method uses a Hall plate with eight or more contacts which are symmetrical with respect to rotation by e.g. 45°. The direction of the current is made to spin discretely by contact commutation. Averaging the consecutive Hall voltages reduces the offset.

SUMMARY OF THE INVENTION

An object of the invention is to simplify and to generalize the switched spinning current method as described, for example, in the article "Offset Reduction in Spinning-Current Hall Plates" by Bellekom and Munter, *Sensors And Materials*, Vol. 5, No. 5, (1994) pages 253–263, and to further reduce the offset voltage.

The inventive method serves for dynamically compensating the offset voltage of a Hall device. The Hall device can have either a platelike structure with a circular conductive area and at least four contacts arranged in pairs of opposite contacts on the circumference of the conductive area, the pairs of contacts being spaced from each other by equal spatial angles or it can have any form deriveable from such a circular arrangement by conformal mapping. It can e.g. be a so called vertical Hall device. The contact pairs are angled by e.g. 90°. Each pair is supplied with a periodically alternating current whereby the phase shift of the supply currents corresponds to the spatial phase shift of the contact pairs and is e.g. 90°. Superposition of the supplied currents results in a continuously spinning current vector in the Hall device. By measuring simultaneously the voltages between corresponding terminals, a signal consisting of the Hall voltage and a periodic offset voltage can be isolated. The offset voltage is eliminated by averaging the signal over at least one period. The advantages achieved compared to already existing methods are the following:

With state-of-the-art discretely spinning current schemes, the number of different current directions is limited to the number of terminals of the Hall device. The continuous spinning current method allows the use of more current settings than device terminals. Thus, aliasing effects as a consequence of discrete sampling can be reduced significantly. In the case of fully time-continuous spinning, these aliasing effects can be avoided completely.

Due to design constraints, Hall devices with more than four terminals increase in size, which makes them more susceptible to material inhomogeneity. The continuous spinning current method is applicable on minimal size Hall plates, and therefore, the lowest possible offset resulting from material inhomogeneity is achieved.

BRIEF DESCRIPTION OF THE DRAWINGS

FIG. 10 is a graphical representation of the change of the remaining offset $V_O$ due to symmetric biasing conditions (with (○) and without (□) control circuitry); and FIG. 11 is a schematic block diagram of a circuit for measuring eight current settings with a four-terminal Hall plate.

DESCRIPTION OF THE PREFERRED EMBODIMENTS

A new method for dynamic compensation of the offset voltage in a four-terminal terminal Hall device used as a magnetic sensor is presented. By applying a harmonic current at 0° and 90° phase angle, the nonperiodic Hall voltage can be separated from the spatially periodic offset voltage. Remaining offsets in the order of the earth magnetic field are achieved.

Figure 1:
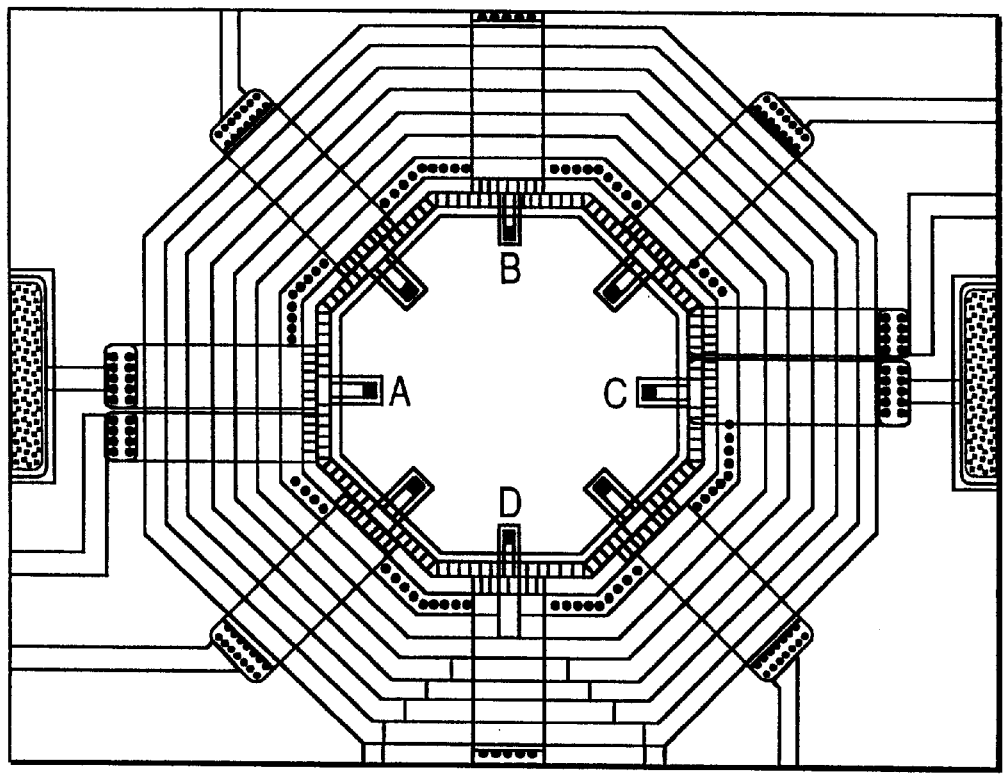
FIG. 1 is a plan view of a micrograph of an eight-contact Hall plate in CMOS technology.

The presented method is implemented for a CMOS Hall device sensitive normal to the chip plane. A chip micrograph is shown in FIG. 1, whereby for the basic function only the contact pairs AC and BD are used. In this example, an n-well of 150 µm in diameter fabricated in a p-substrate constitutes the active area. The method, however, is not restricted to such a so-called lateral Hall device. Any Hall device arrangement that can be achieved by means of conformal mapping is suited, e.g. a vertical Hall device. In the case of a four-terminal Hall device, periodic biasing currents are applied to the contact pair AC and to the pair BD, with $$I_{AC}(\phi)=I_0 \cdot K(\phi), \quad (1)$$

$$I_{BD}(\phi)=I_0 \cdot L(\phi), \quad (2)$$

whereby $I_0$ is the peak current, $K(\phi)$ and $L(\phi)$ are periodic functions. This results in terminal voltages $$V_{AC}(B,\phi)=V_R K(\phi)+V_{HO}(B,\phi)L(\phi) \quad (3)$$

and $$V_{BD}(B,\phi)=V_R L(\phi)+V_{HO}(B,\phi)K(\phi) \quad (4)$$

which consist of a resistive part $V_R$ in phase with the current vector, and a superposition of the Hall and the offset voltage $V_{HO}(B,\phi)=V_H(B)+V_O(\phi)$, phase shifted by 90° with respect to the current. The Hall voltage with periodic offset is isolated from the resistive part by measuring a weighted sum of the voltages between corresponding terminals $$V_{HO}(B,\phi)=V_{AC}(B,\phi)\lambda(\phi)-V_{BD}(B,\phi)\kappa(\phi) \quad (5)$$

with the periodic weight functions $\lambda(\phi)$ and $\kappa(\phi)$ satisfying the relations $$\lambda(\phi)\cdot L(\phi)-\kappa(\phi)\cdot K(\phi)=1 \text{ and } \kappa(\phi)\cdot L(\phi)+\lambda(\phi)\cdot K(\phi)=0. \quad (6)$$

In particular, if $-\kappa(\phi)=K(\phi)=\sin\phi$ and $\lambda(\phi)=L(\phi)=\cos\phi$, the currents applied to the contact pair AC and BD are sinusoids phase shifted by 90°:

$$I_{AC}(\phi)=|I_0|\cdot\sin\phi \quad (7)$$

$$I_{BD}(\phi)=|I_0|\cdot\cos\phi. \quad (8)$$

Figure 2:
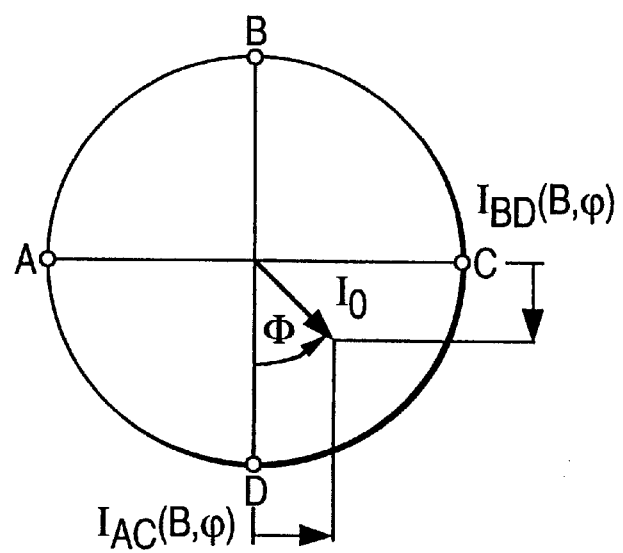
FIG. 2 is a vector diagram of the two biasing currents $I_{AC}(B,\phi)$, $I_{BD}(B,\phi)$ and the resulting continuous spinning current vector $I_0$.
Figure 3:
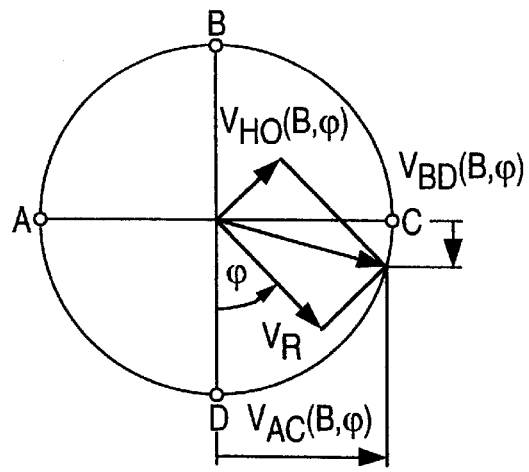
FIG. 3 is a vector diagram of the voltage drop $V_R$ due to $I_0$, its orthogonal part $V_{HO}(B,\phi)$, and the projections $V_{AC}(B,\phi)$ and $V_{BD}(B,\phi)$.

The superposition results in a continuous spinning current vector $I_0$ in the Hall probe (FIG. 2). The resulting voltages $V_R$ and $V_{HO}$ are shown in FIG. 3. From the voltages between corresponding terminals $$V_{AC}(B,\phi)=V_R \sin\phi+V_{HO}(B,\phi)\cos\phi, \quad (9)$$

$$V_{BD}(B,\phi)=V_R \cos\phi-V_{HO}(B,\phi)\sin\phi, \quad (10)$$

the value of $V_{HO}(B,\phi)$ is $$V_{HO}(B,\phi)=V_{AC}(B,\phi)\cos\phi-V_{BD}(B,\phi)\sin\phi. \quad (11)$$

Averaging $V_{HO}(B,\phi)$ over one period reduces the offset $V_O(\phi)$ to its component independent of $\phi$, which is negligible.

Figure 4:
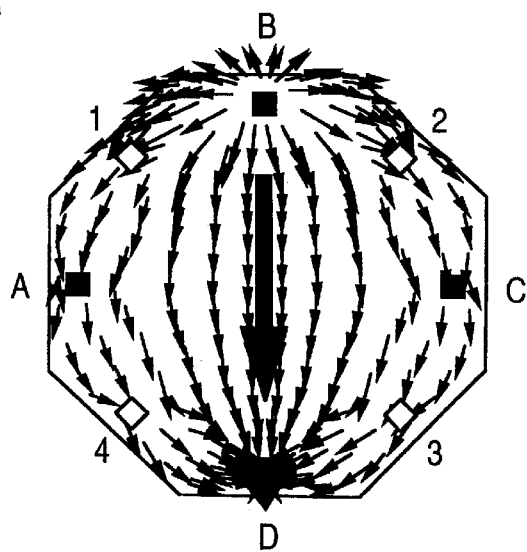
FIG. 4 is a diagram of the current flow for the direction $\phi=0$, result of the biasing currents $I_{AC}(0)=0$ and $I_{BD}(0)=I_0$.
Figure 5:
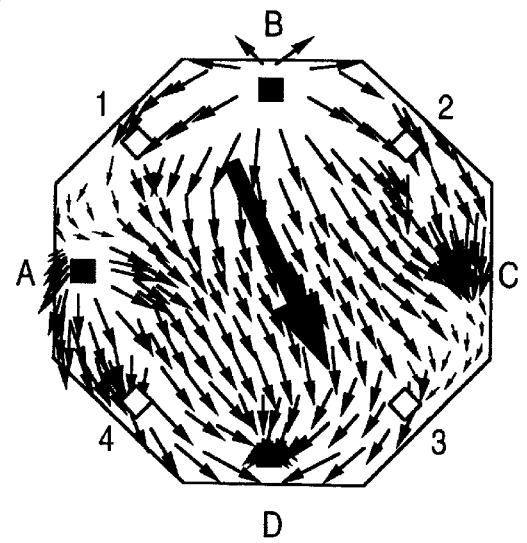
FIG. 5 is a diagram of the flow of current for $\phi=\pi/8$, result of the currents $I_{AC}(\pi/8)=0.383I_0$ and $I_{BD}(\pi/8)=0,923I_0$.
Figure 6:
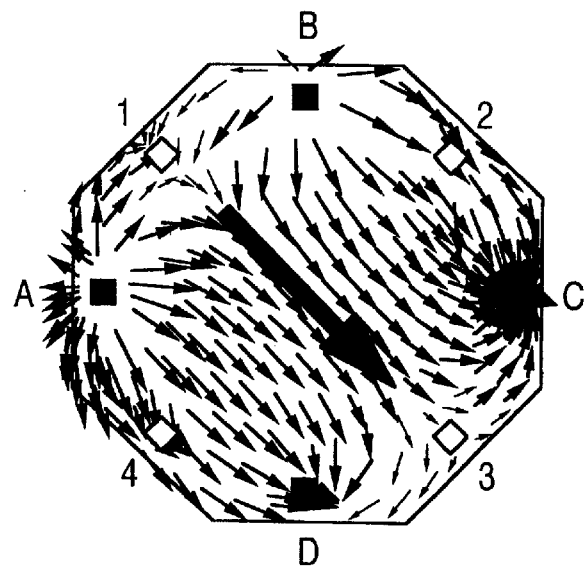
FIG. 6 is a diagram of the current flow for $\phi=\pi/4$ which is the superposition of $I_{AC}(\pi/4)=0.707I_0$ and $I_{BD}(\pi/4)=0,707I_0$.

In FIG. 4 to FIG. 6, finite element simulations of the current flow are shown for different values of the direction $\phi$. This sequence illustrates that the continuous spinning current method is a generalization of the switched method.

The signal $V_{HO}(B,\phi)$ is continuously accessible, allowing a more detailed investigation of the offset behavior (FIG. 7) than the discrete sampling method described in the Bellekom et al article described above. To evaluate the remaining offset voltage $V_O=V_{HO}(0,\phi)$, however, a limited number of measurements per period such as $\phi=2\pi n/N$ with $n \in \{1 \ldots N\}$ is sufficient for a substantial offset reduction. With increasing number of measurement points $V_O$ decreases since aliasing effects are reduced according to the sampling theorem. Using the absolute sensitivity $S_a$, the equivalent offset $B_O=V_O/S_a$ is calculated to be less than 0.1 Gauss (10 $\mu$T).

Figure 8:
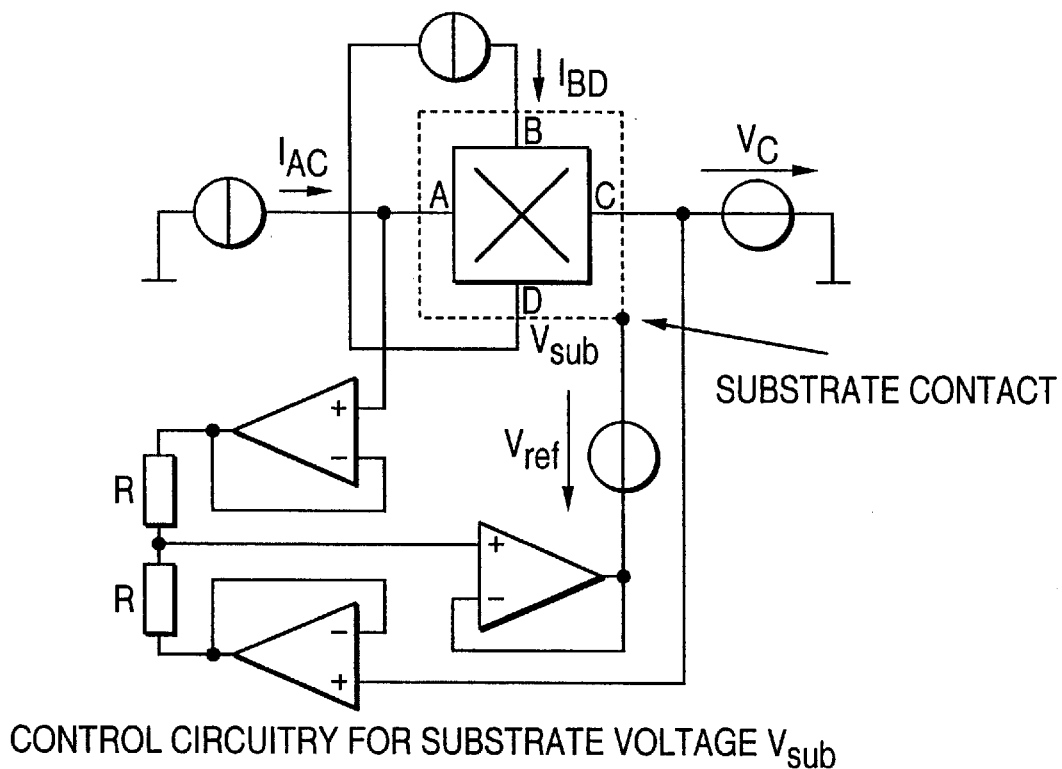
FIG. 8 is a schematic circuit diagram of a measurement setup with circuitry to control the substrate voltage $V_{sub}$, keeping the operating regime symmetric.
Figure 9:
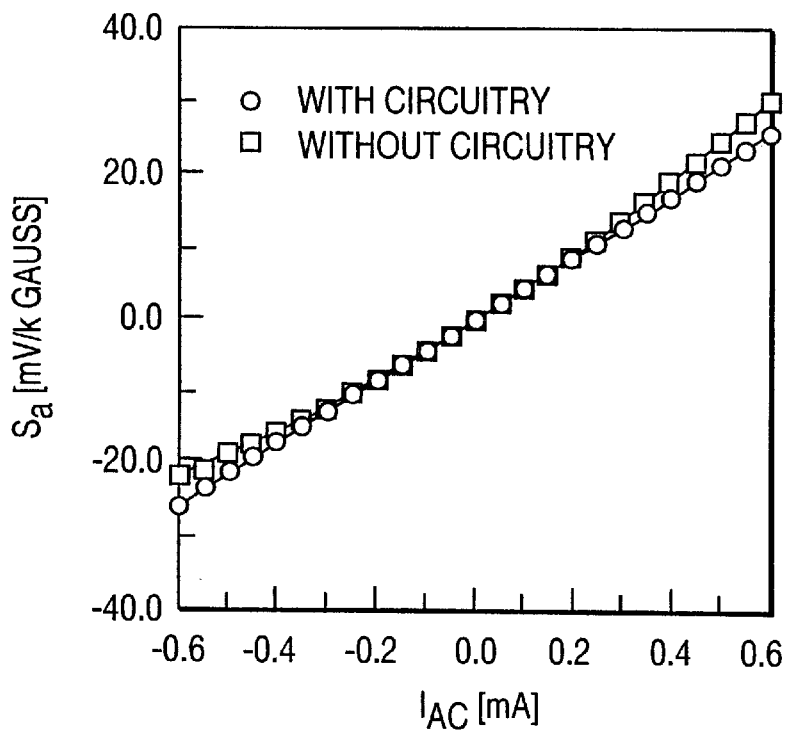
FIG. 9 is a graphical diagram of the sensitivity $S_a(I_{AC})$ with (○) and without (□) control circuitry. The full scale nonlinearity (±0.6 mA) is reduced to <0.2%.

The setup used for the measurements is shown in FIG. 8. The control circuitry keeps the voltage difference between the center of the Hall device and the substrate at a constant value. The sensitivities $S_a(I_{AC})$ and $S_a(I_{BD})$ (FIG. 9) become linear functions; consequently, no higher harmonics of $V_H(B)=S_a\cdot|B|$ are generated. Additionally, the Hall device is biased symmetrically, resulting in lower remaining offsets $V_O$ (FIG. 10).

The inventive method constitutes an improved concept for dynamic offset reduction. The present error sources (limited accuracy of controlling the substrate voltage, limited accuracy of measuring biasing currents and resulting voltages) are improved by on-chip circuitry.

Figure 7:
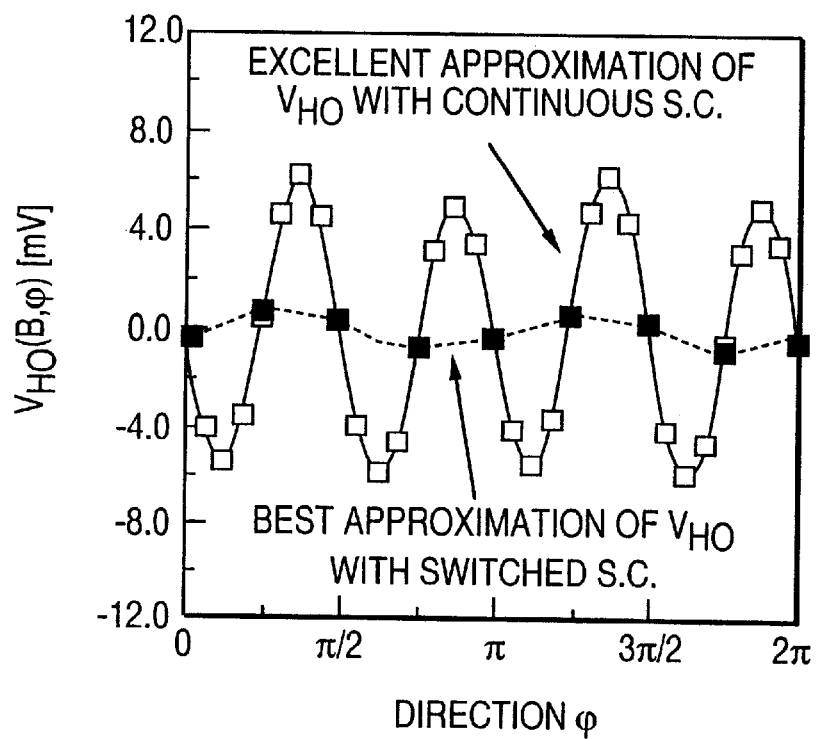
FIG. 7 is a graphical diagram of diagram of $V_{HO}$ versus the direction $\phi$ of vector $I_0$ measured with switched spinning current (●) and continuous spinning current (□)

FIG. 11 shows an embodiment of a circuit which allows to measure the Hall voltage of eight current settings with a Hall plate with only four contacts, which permits the design of a small Hall plate, yet reduces the offset significantly (see FIG. 7). The circuit consists of two matched current sources and two regulated matched current sinks (left), which can be switched to each of the terminals of the Hall plate. An integrating amplifier (right in the Figure) evaluates the difference voltages appropriate for extracting the Hall voltage. By an appropriate sequence of switch settings, the currents applied are $$I_{AC}=\{0,I,2I,I,0,-I,-2I,-I\} \text{ and } I_{BD}=\{2I,I,0,-I,-2I,-I,0,I\} \quad (12)$$

The voltages at the four contacts are evaluated with the sequence $$V_{HO}=\text{mean }\{V_A-V_C, (V_D-V_C)+(V_A-V_B), V_D-V_B, (V_D\cdot V_A)+(V_C-V_B), V_C-V_A, (V_B-V_A)+(V_C-V_D), V_B-V_D, (V_B-V_C)+(V_A-V_D)\}. \quad (13)$$

This can be implemented by simple switches, an amplifier and a low-pass filter. For control of the bias voltage of the Hall plate, one of the matched pairs is regulated by the common-mode voltage of all four Hall plate contacts, while the other pair is used as current reference.

We claim:

1. A method of reducing the offset of a Hall device having a generally circular conductive area and at least four electrical contacts connected to the periphery of the circular conductive area in pairs of opposite contacts, the contact pairs being angularly separated from each other by equal spatial angles, or having an arrangement of conductive area and contacts derived by conformal mapping from said arrangement with the circular conductive area, the method comprising applying to all contact pairs continuously or stepwise alternating currents of a preselected frequency and with phase shifts corresponding to the angles separating the contact pairs from each other to create a bias current rotating in the conductive area continuously or in angular steps smaller than the angles separating the contact pairs, measuring voltage differences across the conductive area in directions perpendicular to the momentary directions of the bias current in succession for a plurality of evenly spaced bias current directions greater than the number of contacts, and averaging the voltage differences measured during at least one rotation period of the bias current.

2. The method according to claim 1 wherein the conductive area of the hall device is mounted on a substrate, including keeping the voltage between the center of the conductive area and the substrate constant.

3. The method according to claim 1 wherein the step of measuring includes sampling the voltage differences in directions of the bias currents separated from a reference direction by angles of $2\pi n/N$, wherein n and N are integers and $0 \leq n \leq N$, and wherein the step of averaging includes calculating the average from a weighted sum of voltages measured at the contacts.

4. The method according to claim 1 wherein the Hall device comprises two pairs of contacts (A/C, B/D) angularly separated by 90°.

5. The method according to claim 4 wherein the step of applying includes applying to the two pairs of contacts currents ($I_{AC}$, $I_{BD}$) which are increased and decreased in equal steps, the currents being separated from each other by a phase angle of n/4 so that alternating currents in the form 0, I, 2I, I, 0, −I, −2I, −I are generated.

6. The method according to claim 5 including sampling voltages at the four contacts ($V_A$, $V_B$, $V_C$, $V_D$) between the current steps, and the voltage differences are calculated in the sequence $V_A-V_C$ for $I_{AC}=0$ and $I_{BD}=2I$, followed by $(V_D-V_C)+(V_A-V_B)$; $(V_D-V_B)$; $(V_D-V_A)+(V_C-V_B)$; $(V_C-V_A)$; $(V_B-V_A)+(V_C-V_D)$; $(V_B-V_D)$; $(V_B-V_C)+(V_A-V_D)$.

7. A Hall device comprising
   a circular conductive area;
   at least four contacts positioned on the circumference of said conductive area in pairs of contacts opposite each other, said contact pairs being angularly spaced from each other by equal angles, or comprising an arrangement of conductive area and pairs of contacts derived by conformal mapping from said arrangement with a circular conductive area;
   means for applying to all contact pairs alternating currents at a selected frequency and with phase shifts corresponding to the angles separating said contact pairs from each other for creating a bias current rotating in said conductive area continuously or in angular steps smaller than said angles separating said contact pairs from each other;
   means for measuring voltage differences across said conductive area perpendicular to directions of said bias current successively for a plurality of evenly spaced bias current directions greater than the number of contacts; and
   means for averaging said voltage differences measured during at least one rotation period of said bias currents.

8. A Hall device according to claim 7 having four contacts spaced from each other by angles of 90°.

9. A Hall device according to claim 8 wherein said means for measuring includes a matched pair of current sinks and a matched pair of current sources, and means for independently switching said sinks and sources to said four contacts.

10. A Hall device according to claim 7 wherein said circular conductive area is supported on a substrate and lies within a plane of said substrate or is perpendicular to said plane of said substrate.

* * * * *